United States Patent [19]
Andresen

[11] Patent Number: 6,115,438
[45] Date of Patent: Sep. 5, 2000

[54] METHOD AND CIRCUIT FOR DETECTING A SPURIOUS LOCK SIGNAL FROM A LOCK DETECT CIRCUIT

[75] Inventor: Bernhard H. Andresen, Dallas, Tex.

[73] Assignee: Texas Instruments Incorporated, Dallas, Tex.

[21] Appl. No.: 08/986,509

[22] Filed: Dec. 8, 1997

Related U.S. Application Data

[60] Provisional application No. 60/033,328, Dec. 12, 1996.

[51] Int. Cl.[7] ........................................................ H04L 7/00
[52] U.S. Cl. ............................................................. 375/373
[58] Field of Search ..................................... 375/371, 373, 375/375, 376; 327/150, 141, 159, 147, 162

[56] References Cited

U.S. PATENT DOCUMENTS

| | | | |
|---|---|---|---|
| 5,483,558 | 1/1996 | Leon et al. | 375/376 |
| 5,889,828 | 3/1999 | Miyashita et al. | 375/376 |

*Primary Examiner*—Tesfaldet Bocure
*Attorney, Agent, or Firm*—Wade James Brady, III; Frederick J. Telecky, Jr.

[57] ABSTRACT

A method and circuit for detecting a spurious lock signal from a lock detect circuit are disclosed. The method includes generating a lock signal (16, 58, 84) having two states: lock and unlock. The lock signal (16, 58, 84) is monitored at a debounce circuit (50, 80). A reference clock signal (56, 86) is then received at the debounce circuit (50, 80). A clean lock signal (68, 88) is generated by the debounce circuit (50, 80) when the lock state of the lock signal (16, 58, 84) is received for at least two cycles of the reference clock. If the lock state of the lock signal (16, 58, 84) is received for less than two cycles of the reference clock, a clean loss-of-lock signal (68, 88) is generated. The circuit for detecting a spurious lock signal (50, 80) includes a lock detect circuit for generating a lock signal (10) and a plurality of flip-flops (70, 72, 92, 94, 96, 98). Each flip-flop (70, 72, 92, 94, 96, 98) has a data input (54, 82), a clock input (60, 106), a clear input (62, 102) for receiving the lock signal, and a data output (66, 108). A reference clock signal (56, 86) is connected to the clock input (60, 106) of each flip-flop (70, 72, 92, 94, 96, 98). The circuit further includes a clear lock signal output (68, 88).

20 Claims, 1 Drawing Sheet

METHOD AND CIRCUIT FOR DETECTING A SPURIOUS LOCK SIGNAL FROM A LOCK DETECT CIRCUIT

RELATED APPLICATIONS

This application claims priority under 35 USC §119(c) (1) of Provisional Application No. 60/033,328, filed Dec. 12, 1996.

This application is related to co-pending application "Method and Circuit for Detecting Phase Lock of a Phase Lock Loop," Ser. No. 08/986,029, filed Dec. 8, 1997 (TI-20942), commonly owned and assigned with the present application.

TECHNICAL FIELD OF THE INVENTION

This invention relates generally to the field of electronic circuits and more particularly to a method and circuit for detecting a spurious lock signal from a lock detect circuit.

BACKGROUND OF THE INVENTION

A phase locked loop phase lock detector is used to determine when two periodic time-varying signals are "in phase," i.e., reaching the maximum and minimum values at the same time. A phase locked loop phase lock detector may be used in digital circuits to determine when the phase of an external digital signal is phase-aligned with the phase of a local oscillator. When the signals are phase-aligned, a phase lock signal is generated that may be used to enable any circuitry that requires the external signal to be phase-aligned with the local oscillator for proper function.

Phase lock may be spuriously indicated under several conditions. If a first signal is in phase with a second signal but has a frequency that is twice that of the second signal, then signal lock will be followed by loss-of-lock once each cycle. Random matches between asynchronous signals may also cause spurious lock indications. Likewise, other lock circuits may generate spurious lock indications. These spurious lock signals may cause the lock signal to "bounce" between a lock and unlock indication.

Such spurious lock indications may potentially cause misoperation of equipment, or increase equipment duty cycles. While some methods exist for detecting and "debouncing" spurious lock indications, such methods typically consist of waiting for an empirically-determined period of time until most spurious indications have been damped. This technique is not useful, however, when the frequency of one signal is twice the frequency of the other. Therefore, a need has arisen for a new method and circuit for detecting a spurious lock signal that overcomes the disadvantages and deficiencies of the prior art.

SUMMARY OF THE INVENTION

A method for detecting a spurious lock signal is provided. The method includes generating a lock signal having two states: lock and unlock. The lock signal is monitored at a debounce circuit. A reference clock signal is then received at the debounce circuit. A clean lock signal is generated when the lock state of the lock signal is received for at least two cycles of the reference clock signal. If the lock state of the lock signal is received for less than two cycles of the reference clock signal, a clean loss-of-lock signal is generated.

In another embodiment, a circuit for detecting a spurious lock signal is provided that includes a circuit for generating a lock signal and at least one flip-flop. The flip-flop has a data input, a clock input, a clear input for receiving the lock signal, and a data output. A reference clock signal is connected to the clock input of the flip-flop. The circuit further includes a clear lock signal output.

A technical advantage of the present invention is that a circuit for detecting a spurious lock signal is provided. Another technical advantage is that the invention provides a method for detecting a spurious lock signal. Another technical advantage is that the present invention does not require a predetermined period of time to elapse before signal lock may be determined. Another technical advantage is that the present invention may be implemented without any analog components.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE INVENTION

Figure 1:
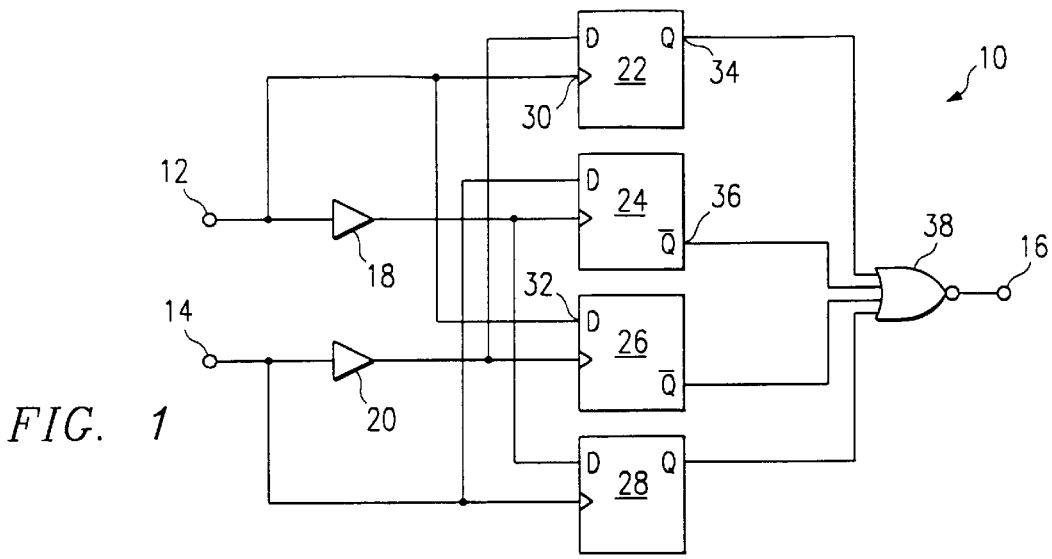
FIG. 1 is a lock detect circuit for detecting phase lock of a phase locked loop.
Figure 2:
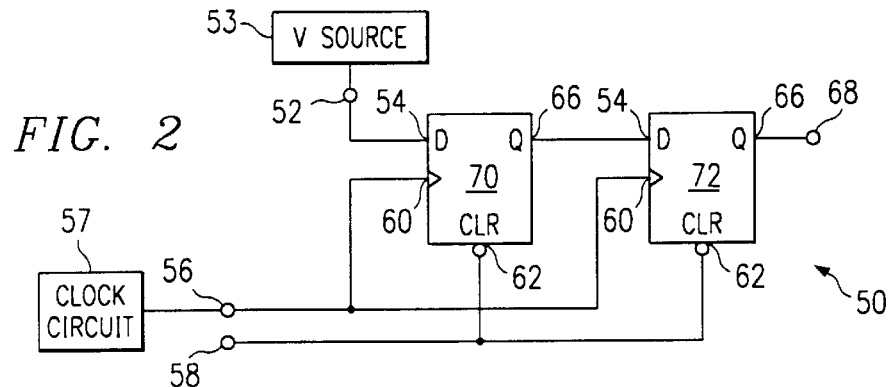
FIG. 2 is a debounce circuit for use with the circuit of FIG. 1.
Figure 3:
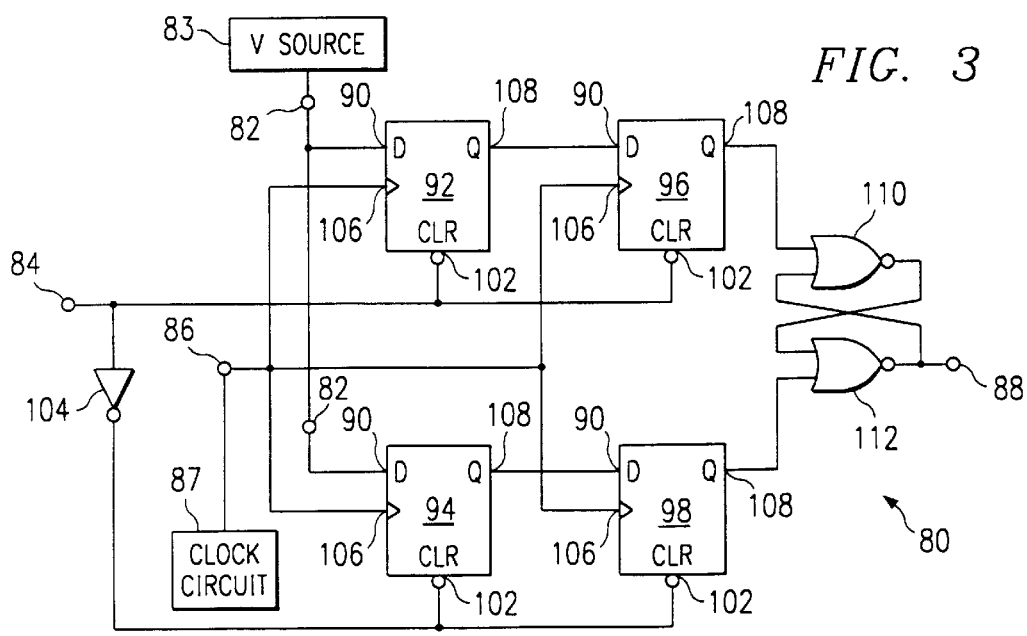
FIG. 3 is an alternative debounce circuit for use with the circuit of FIG. 1.

The preferred embodiment of the present invention and its advantages are best understood by referring to FIGS. 1 through 3 of the drawings, like numerals being used for like and corresponding parts of the various drawings.

FIG. 1 is a circuit 10 for detecting phase lock of two signals, such as in a delay locked loop, a phase locked loop, or many other circuits where phase lock of two independent circuits must be determined. Circuit 10 includes data inputs 12 and 14 and a data output 16. Digital data signals are received at data inputs 12 and 14. When these digital data signals are in phase, data output 16 will have a predetermined digital data value representative of in-phase signals, such as a one ("1") or a zero ("0"). Likewise, when these digital data signals are out-of-phase, data output 16 will have a predetermined digital data value representative of an out-of-phase signal that is the opposite of the in-phase signal output, such as a "0" or "1", respectively.

Circuit 10 further comprises delay circuits 18 and 20 and flip-flops 22, 24, 26, and 28. As shown in FIG. 1, delay circuits 18 and 20 are single circuit elements, but may alternatively comprise two or more discrete circuit elements. Data input 12 couples to the input of delay circuit 18, and data input 14 couples to the input of delay circuit 20. Delay circuits 18 and 20 introduce a time delay in the transmission of the digital data signal received from data inputs 12 and 14, respectively.

For example, a digital data signal received at the input of delay circuit 18 may not be transmitted from the output of delay circuit 18 until a predetermined period of time has elapsed. This predetermined period of time is typically less than the period of a clock signal that is used to regulate the operation of data processing circuitry (not explicitly shown) which is coupled to data output 16.

Data input 12 is also coupled to a clock input 30 of flip-flop 22 and a data input 32 ("D") of flip-flop 26. Flip-flops 22, 24, 26, and 28 are clocked D flip-flops, each having a data input similar to data input 32 of flip-flop 26 and a clock input similar to clock input 30 of flip-flop 22. When the signal received at the clock input changes from a value equal to digital "0" to a value equal to digital "1" (the "leading edge" of the clock signal), then the digital signal value that is being received at the data input is generated at the data output of the flip-flop, such as data output 34 ("Q") of flip-flop 22.

Each flip-flop 22, 24, 26, and 28 may have a normal data output such as data output 34 of flip-flop 22. Alternately, each flip-flop may have an inverted data output such as data output 36 of flip-flop 24, in which the digital value of the generated digital signal is opposite to the value of the digital signal value received at the data input. For example, if a signal representing "1" is received the data input of flip-flop 24, then the signal generated at data output 36 of flip-flop 24 will represent "0." Each flip-flop may also have one normal data output and one inverted data output (not explicitly shown).

Data input 14 is coupled to the clock input of flip-flop 28 and the data input of flip-flop 24. The output of delay circuit 18 is coupled to the data input of flip-flop 28 and the clock input of flip-flop 24. The output of delay circuit 20 is coupled to the data input of flip-flop 22 and the clock input of flip-flop 26. The normal data outputs of flip-flops 22 and 28 and the inverted data outputs of flip-flops 24 and 26 are coupled to the input to NOR gate 38. The output of NOR gate 38 is coupled to data output 16.

In operation, two time-varying digital data signals are received at data inputs 12 and 14, respectively. When both time-varying digital data signals are in-phase, the value of the signal generated at data output 16 will be "1." Likewise, when both digital data signals are out-of-phase, the value of the signal generated at data output 16 will be "0." The signals are considered to be in-phase when the leading edge transition for both signals occurs within a predetermined time period T. The value of T will depend on data transmission frequencies and other system parameters that cause variations in data (the "jitter period"), but is typically set to be no more than two times the jitter period.

The signal generated at data output 16 of circuit 10 will be "1" only when all inputs to NOR gate 38 are "0." The output of flip-flop 22 will be "0" when the leading edge transition of data input 12 occurs at a time no greater than T prior to the leading edge transition of data input 14. In other words, data input 14 may either lag data input 12, or may lead data input 12 by a time equal to or less than T and the output of flip-flop 22 will still be "0.".

Likewise, the output of flip-flop 28 will be zero when data input 12 lags data input 14, or leads data input 14 by a time equal to or less than T. Thus, the outputs of flip-flops 22 and 28 will be "0" if the leading edge transitions of data input 12 and 14 occur within a time period equal to T of each other, and one of the outputs will be "1" if the leading edge transitions of data inputs 12 and 14 occur within a time period that is greater than T of each other.

Flip-flop 24 has an inverted data output 36, and will generate an output of "0" when data input 14 leads data input 12 or lags data input 12 by a time period less than or equal to T. Likewise, flip-flop 26 will generate an output of "0" when data input 12 leads data input 14 or lags data input 14 by a time period less than or equal to T. Thus, the outputs of flip-flops 24 and 26 will be "0" if the leading edge transitions of data signals 12 and 14 occur within a time period equal to T of each other, and one of the outputs will be "1" if the leading edge transitions of data inputs 12 and 14 occur within a time period that is greater than T of each other.

If data inputs 12 and 14 are operating in phase, the outputs of all flip-flops will remain at "0" and the value of data output 16 will be "1," indicating phase lock. If data input 14 becomes constant with a value of "0," then flip-flops 22, 26, and 28 will continue to generate an output of "0." Flip-flop 24 will generate an output of "1" after the next leading edge of data input 14 is transmitted by delay circuit 18. Thus, circuit 10 will generate a signal at data output 16 having a value of "0," indicating loss-of-lock, when data input 14 stops transmitting and becomes constant with a value of "0." Likewise, flip-flop 26 will generate an output of "1" if data input 12 becomes constant with a value of "0."

If data inputs 12 and 14 are operating in phase and data input 14 becomes constant with a value of "1," then flip-flops 24, 26, and 28 will continue to generate an output of "0." Flip-flop 22 will generate an output of "1" after the next leading edge of data signal 14 is transmitted. Thus, circuit 10 will generate a signal at data output 16 having a value of "0," indicating loss-of-lock, when data input 14 stops transmitting and becomes constant with a value of "1." Likewise, flip-flop 28 will generate an output of "1" if data input 12 becomes constant with a value of "1."

Thus, lock detect circuit 10 for detecting phase lock generates a predetermined signal output representative of phase lock when two data signals are received that have leading edge transitions that occurs within a predetermined time period T. Likewise, circuit 10 generates a different predetermined signal output if the two data signals received are out-of-phase by an amount greater than the predetermined time period T. If two in-phase signals subsequently go out-of-phase, then the output of circuit 10 will change accordingly.

If data input 12 is a local reference oscillator with an independent fault detector, then circuit 10 may be implemented without flip-flop 26. Likewise, if data input 14 is a local reference oscillator with an independent fault indicator, then circuit 10 may be implemented without flip-flop 24. In either case, the independent fault detector may still be used to provide an indication that the local reference oscillator has failed by including flip-flops 26 and 24, respectively. Implementing circuit 10 without flip-flops 24 and 26 will result in the continued generation of a lock signal if one of data inputs 12 and 14 becomes constant at "0" after having been locked with the other data input. Circuit 10 may also be implemented without delay circuits 18 and 20 if flip-flops 22 and 28 have a negative hold time that is equal to T and flip-flops 24 and 26 have a negative setup time equal to T.

FIG. 2 is a debounce circuit 50 for use with circuit 10 of FIG. 1. Debounce circuit 50 may also be used with many other circuits in which short-term variations in a periodic signal are damped, such as lock detect circuits that may generate spurious lock or unlock signals. Debounce circuit 50 includes data constant signal 52, which may be provided by a voltage source 53 coupled to data input 54 of flip-flop 70, and reference clock 56, produced by clock circuit 57, and lock signal input 58, which couple to clock inputs 60 and active low clear inputs 62 of flip-flops 70 and 72. Output 66 of flip-flop 70 couples to data input 54 of flip-flop 72. Output 66 of flip-flop 72 couples to clean lock output 68.

In the embodiment shown in FIG. 2, lock signal input 58 has a value of digital "1" until loss of lock occurs, at which point lock signal input 58 receives a value of digital "0." This signal clears flip-flops 70 and 72, such that the signal generated at clean lock output 68 has the digital value "0." When signal lock is reacquired, then lock signal input 58 enables flip-flops 70 and 72. At the next clock cycle, the value of data constant signal 52 indicating signal lock (such as digital "1") propagates from data input 54 to output 66 of flip-flop 70.

If lock signal input 58 continues to enable flip-flops 70 and 72, then the value of data constant signal 52 propagates from data input 54 to output 66 of flip-flop 72 through one flip-flop stage for every clock cycle, and is ultimately transmitted over clean lock output 68. In this manner, lock signal input 58 must receive a signal indicating lock for at least two clock cycles before clean lock output 68 will generate a lock signal. Additional flip-flop stages may be added or removed in order to change the number of clock cycles required for the clean lock signal to propagate through.

FIG. 3 is a debounce circuit 80 for use with circuit 10 of FIG. 1 which provides debounce on both lock and unlock conditions. Debounce circuit 80 includes constant data signal 82, lock signal 84 generated by a lock detect circuit such as the circuit of FIG. 1, continuous reference clock signal 86 and clean lock output signal 88. Constant data signal 82 may be a voltage source 83 that is coupled to data inputs 90 of flip-flops 92 and 94. Lock signal 84 couples to active low clear inputs 102 of flip-flops 92 and 96, and to active low clear inputs 102 of flip-flops 94 and 98 after being inverted by inverter 104. Reference clock signal 86 couples to clock input 106 of flip-flops 92, 94, 96, and 98.

Output 108 of flip-flop 92 couples to data input 90 of flip-flop 96. Output 108 of flip-flop 94 couples to data input 90 of flip-flop 98. Output 108 of flip-flop 96 couples to the input of NOR gate 110. Output 108 of flip-flop 98 couples to the input of NOR gate 112. The output of NOR gate 110 is coupled to the input of NOR gate 112. The output of NOR gate 112 is coupled to the input to NOR gate 110 and also to clean lock output 88.

In operation, lock signal 84 carries a digital signal indicating either a lock or an unlock condition. If this signal is "1," then flip-flops 92 and 96 will be transmitting constant data signal 82, having a value of "1," to NOR gate 110, thus forcing the output of NOR gate 110 to "0." Flip-flops 94 and 98 will be blocking the constant data signal 82 such that output 108 of flip-flop 98 transmits a "0" to NOR gate 112, thus forcing the output of NOR gate 112 to "1." Therefore, when a lock signal 84 of "1" is received, clean lock output 88 of debounce circuit 80 will also be "1."

If lock signal 84 subsequently changes to "0," then the signal received at clear input 102 to flip-flops 92 and 96 causes output 108 of flip-flop 96 and the input to NOR gate 110 to become "0." The signal received at clear input 102 to flip-flops 94 and 98 enables flip-flops 94 and 98 to begin transmitting the constant data signal 82 value of "1" on the next clock cycle. Nevertheless, the value of output 108 of flip-flop 98 and the input to NOR gate 112 will remain "0" for two clock cycles. The change in value of output 108 of flip-flop 96 from "1" to "0" does not change the value of the output of NOR gate 110 from "0," as NOR gate 112 is still outputting "1." Therefore, NOR gate 112 receives inputs of "0 0," and continues to output a value of "1" for the first clock cycle after the change in lock signal 84.

After lock signal 84 has been "0" for two cycles, output 108 of flip-flop 98 becomes "1," which causes the inputs received at NOR gate 112 to become "0 1." Therefore, the output of NOR gate 112 becomes "0," which causes the following to occur in sequence: the inputs to NOR gate 110 become "0 0;" the output of NOR gate 110 becomes "1;" and the inputs of NOR gate 112 become "1 1." The output of NOR gate 112 and clean lock output 88 thus stabilizes at the value of "0" if the value of lock signal 84 changes from "1" to "0" for two clock cycles.

When the value of lock signal 84 changes back to "1" after being "0" for more than two clock cycles, then flip-flops 92 and 96 begin transmitting a signal with a value of "1" and outputs 108 of flip-flops 94 and 98 output a signal with a value of "0." The input to NOR gate 112 changes to "1 0," and the output of NOR gate 112 remains at the value of "0." After two clock cycles, the output of flip-flop 96 becomes "1," causing the input to NOR gate 110 to become "1 0" and the output of NOR gate 110 to become "0." The input to NOR gate 112 changes to "0 0," and the output of NOR gate 112 stabilizes at "1" if the value of lock signal 84 changes from "0" to "1" for two clock cycles.

Therefore, any change in lock signal 84 must be maintained for at least two cycles before the change is reflected in clean lock output 88. With the debounce circuitry of the present invention, a spurious lock signal caused by random alignment of asynchronous signals or phase alignment of two signals with a harmonic frequency relationship can be filtered. Likewise, a spurious unlock signal caused by noise or other temporary conditions may also be filtered.

The present invention offers many technical advantages. One technical advantage of the present invention is a phase locked loop lock detector circuit that does not require circuitry for determining the pulse width of very small pulses. Another advantage of the present invention is a phase locked loop lock detector circuit that includes no analog components.

While the invention has been particularly shown and described by the foregoing detailed description, it will be understood by those skilled in the art that various other changes in form and detail may be made without departing from the spirit and scope of the invention as defined by the appended claims. For example, circuit elements other than the ones shown herein and described above may be used. Where a signal value of "1" is used to indicate lock, the value of "0" may alternately be used.

What is claimed is:

1. A method for detecting a spurious lock signal from a lock detect circuit, the method comprising the steps of:

generating in the lock detect circuit a lock signal having two states;

monitoring the lock signal at a debounce circuit;

receiving a reference clock signal at the debounce circuit;

generating at the debounce circuit a clean lock signal when the first state of the lock signal is received for at least two cycles of the reference clock signal; and generating at the debounce circuit a clean loss-of-lock signal when the first state of the lock signal is received for less than two cycles of the reference clock signal.

2. The method of claim 1 wherein the debounce circuit comprises at least one flip-flop and wherein the monitoring step comprises receiving the lock signal at a clear input of each flip-flop.

3. The method of claim 1 wherein the debounce circuit is at least one flip-flop and further comprising the step of receiving a constant data value at a data input of the first flip-flop.

4. The method of claim 1 wherein the debounce circuit is at least two flip-flops and wherein the monitoring step comprises receiving the lock signal at a clear input of the first flip-flop and receiving an inverted lock signal at a clear input of the second flip-flop.

5. The method of claim 1 wherein the debounce circuit is at least two flip-flops and further comprising the step of transmitting an output of each flip-flop to a corresponding NOR gate.

6. The method of claim 1 wherein the debounce circuit is at least two flip-flops and further comprising the steps of:

transmitting an output of each flip-flop to a corresponding NOR gate; and cross-coupling an output of each NOR gate to an input of the other NOR gate.

7. A circuit for detectng a spurious lock signal, the circuit comprising:

a lock detect circuit for generating a lock signal;

a debounce circuit having at least one flip-flop having a data input, a clock input, a clear input for receiving the lock signal, and a data output;

a clock circuit for generating a reference clock signal coupled to each clock input; and a clean lock signal output coupled to said data output.

8. The circuit of claim 7 wherein the data output of the first flip-flop is coupled to the data input of a second flip-flop.

9. The circuit of claim 7 further comprising a voltage source for generating a constant signal coupled to the data input of the first flip-flop.

10. The circuit of claim 7 wherein the data output of the first flip-flop is coupled to the data input of a second flip-flop.

11. The circuit of claim 7 wherein the at least one flip-flop further comprises an even number of flip-flops, the output of the lock detect circuit is coupled to the clear input of the first half of the flip-flops, and the output of the circuit for generating a lock signal is inverted and coupled to the clear input of the second half of the flip-flops.

12. The circuit of claim 7 wherein the at least one flip-flop further comprises at least four flip-flops, a voltage source for generating a constant signal coupled to the data input of the first and the second flip-flops, the data output of the first flip flop coupled to the data input of the third flip-flop, and the data output of the second flip-flop coupled to the data input of the fourth flip-flop.

13. The circuit of claim 12 wherein the data output of the third flip-flop is coupled to an input of a first NOR gate, the data output of the fourth flip-flop Is coupled to an input of a second NOR gate, an output of each NOR gate is cross-connected to the input of the other NOR gate, and the clean lock signal output is coupled to the output of the second NOR gate.

14. The circuit of claim 7 wherein the at least one flip-flop further comprises an even number of flip-flops, the data output of one of the first half of the flip-flops is coupled to an input of a first NOR gate, the data output of one of the second half of the flip-flops is coupled to an input of a second NOR gate, an output of each NOR gate is cross-connected to the input of the other NOR gate, and the clean lock signal output is coupled to the output of the second NOR gate.

15. The circuit of claim 7 wherein the lock detect circuit is a phase locked loop lock detector circuit.

16. A circuit for detecting a spurious lock signal, the circuit comprising:

at least four flip-flops, each having a data input, a clock input, a clear input, and a data output;

a clock for generating a reference clock signal coupled to each clock input;

a lock detect circuit for generating a lock signal coupled to each clear input;

a voltage source for generating a constant signal coupled to the data input of the first and second flip-flops;

the data output of the first flip-flop coupled to the data input of the third flip-flop; and the data output of the second flip-flop coupled to the data input of the fourth flip-flop.

17. The circuit of claim 16 wherein the output of the lock detect circuit coupled to the clear input of the first and third flip-flops, and the output of the lock detect circuit is inverted and coupled to the clear input of the clear input of the second and fourth flip-flops.

18. The circuit of claim 16 wherein the data output of the third flip-flop coupled to a first logic gate, the data output of the fourth flip-flop coupled to a second logic gate.

19. The circuit of claim 16 wherein the data output of the third flip-flop coupled to an input of a first NOR gate, the data output of the fourth flip-flop coupled to an input of a second NOR gate, and an output of one NOR gate is cross-connected to the input of the other NOR gate.

20. The circuit of claim 16 wherein the lock detect circuit is a phase locked loop lock detector circuit.

* * * * *